United States Patent [19]
Pomerantz et al.

[11] 3,959,731
[45] May 25, 1976

[54] METHOD OF PROVIDING LONG TIME INTERVALS BETWEEN OUTPUTS OF A TIMING MEANS

[75] Inventors: Daniel I. Pomerantz, Lexington; David O. Veinot, Arlington, both of Mass.

[73] Assignee: P. R. Mallory & Co., Inc., Indianapolis, Ind.

[22] Filed: Mar. 14, 1973

[21] Appl. No.: 341,042

Related U.S. Application Data

[63] Continuation-in-part of Ser. No. 169,729, Aug. 6, 1971, abandoned.

[52] U.S. Cl. ................................ 328/129; 307/232; 307/269; 307/293; 328/61; 328/110
[51] Int. Cl.² ..................... H03D 13/00; H03K 5/13
[58] Field of Search ........... 307/218, 232, 233, 262, 307/269, 293; 328/61, 63, 72, 109, 110, 129, 133

[56] References Cited
UNITED STATES PATENTS

| | | |
|---|---|---|
| 3,206,684 | 9/1965 | Der et al. .............................. 328/110 |
| 3,250,923 | 5/1966 | Liska et al. .......................... 307/293 |
| 3,304,504 | 2/1967 | Horlander ............................. 328/72 |
| 3,441,745 | 4/1969 | Reeves et al. ......................... 328/133 |
| 3,518,556 | 6/1970 | Holmboe et al. ..................... 328/133 |
| 3,522,455 | 8/1970 | Thomas et al. ....................... 307/269 |
| 3,526,841 | 9/1970 | Holmboe et al. ..................... 328/133 |

*Primary Examiner*—Stanley D. Miller, Jr.
*Attorney, Agent, or Firm*—Hoffmann, Meyer & Hanson

[57] ABSTRACT

Starting at the same time, two timing means produce a series of output pulses at slightly different frequencies. When the two output pulses coincide, a single output pulse is produced. This will occur at a frequency equal to the difference between frequences of two original timing means and the interval between the single outputs will increase as the difference between the frequencies of the two timing means is made smaller.

5 Claims, 5 Drawing Figures

INVENTORS
DANIEL I. POMERANTZ
DAVID O. VEINOT
BY Robert J Meyer
ATTORNEY

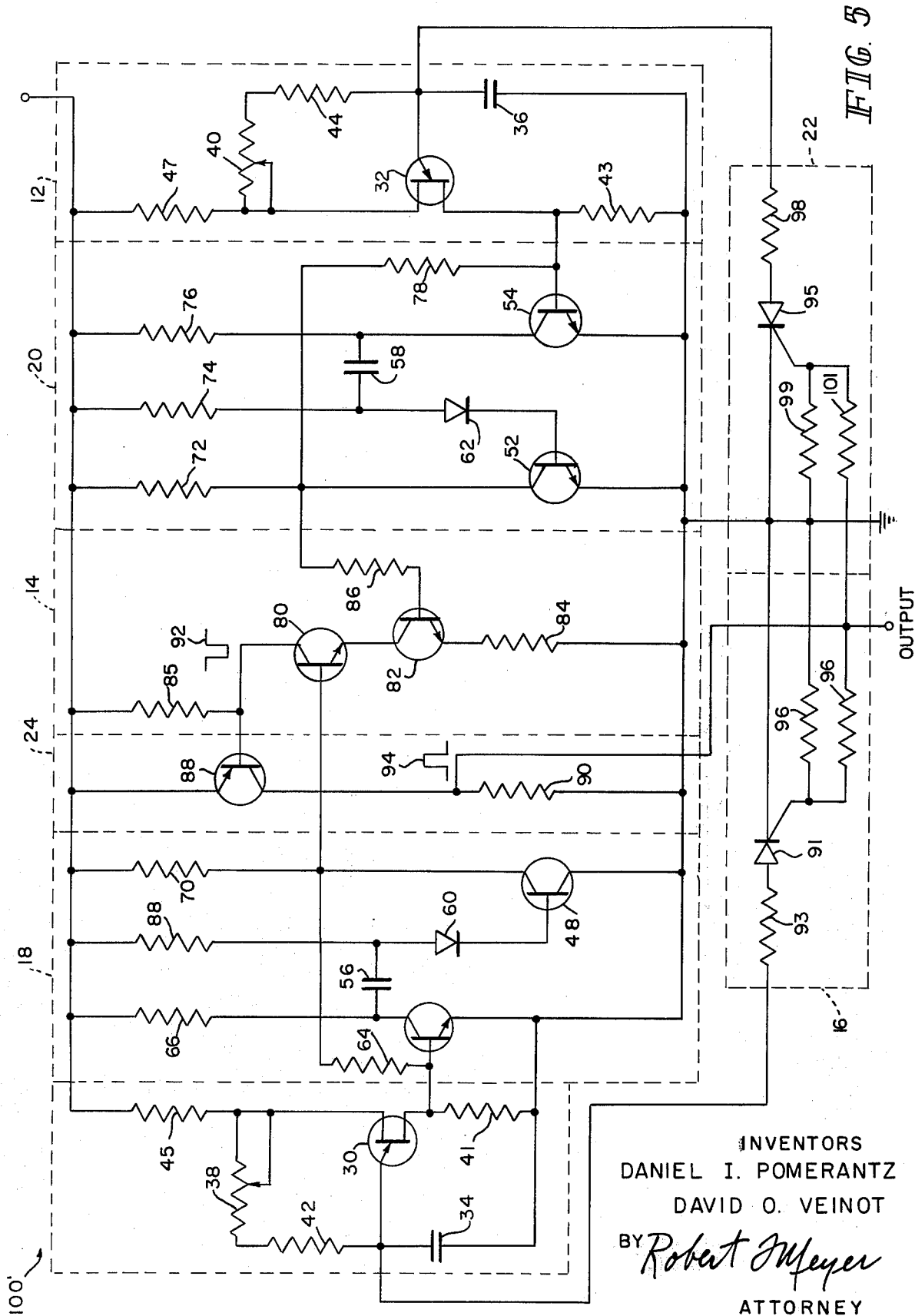

METHOD OF PROVIDING LONG TIME INTERVALS BETWEEN OUTPUTS OF A TIMING MEANS

This is a continuation-in-part of application Ser. No. 169,729 filed Aug. 6, 1971, now abandoned.

This invention relates to a means and method for producing long time constants or long time intervals between outputs.

There are many instances a timer is needed which has long time intervals between output pulses. For example, a timer for an appliance such as a cooking stove might require a long time interval for baking, or in industrial applications, a long time interval between outputs of the timer may be required in applications such as operation of presses where a mold needs to be under pressure for a long period of time and then released. Such long time intervals or time constants for timing needs are not easily achieved by conventional methods such as by for example RC time constants.

It is, therefore, an object of the present invention to provide a means and method for producing long time constant or having a relatively long time interval between outputs.

Another object of the invention is the provision of a timer and method of producing a long time constant by comparing and correlating two separate series of pulses.

Still another object of the invention is the provision of a timer and a method of operating same wherein first and second timing means produce a series of output pulses at different time intervals and different time durations with detecting means detecting the output pulses and providing a single output when the two series of output pulses coincide.

A further object of the present invention is to provide a timer and method of operating same wherein a long time constant is determined by the difference between the frequencies of two original timing means.

Yet another object of the invention is the provision of a timer having a long time constant between outputs which is determined by the correlation of two separate timing means and wherein the smaller the difference between the two timing means, the longer will be the time constant.

Another object of the invention is to provide a timer which includes two timing means, and a detecting means receiving the outputs of the two timing means and, when the outputs coincide, providing its output.

Still another object of the invention is to provide a timer which includes two electronic timing circuits, pulse stretching means receiving electrical pulses from the timing means and detecting means receiving the lengthened pulses, and when they coincide, providing an output.

Another object of the invention is to provide a timer which includes two electronic timing circuits, a detecting means receiving electrical pulses from the timing circuits, and when the pulses coincide, delivering an output, and inverter means reversing the polarity of the output of the detecting means.

Yet still another object of the invention is to provide a timer including two electronic timing circuits, detecting means receiving electrical pulses from the circuits, and when they coincide delivering an output pulse, and synchronizing means insuring that the two electronic timing circuits will be synchronized in their starting time at the end of the output pulse from the detecting means.

These and other objects of the invention will become apparent from the following description taken in conjunction with the accompanying drawings wherein:

FIGS. 4 and 5 are wiring diagrams showing two embodiments of the timer of the present invention.

Generally speaking, the objects of the invention are accomplished by providing in combination a first timing means producing a series of outputs at $T_1$ time intervals and of $t_1$ duration, a second timing means producing a series of output pulses at a time interval $T_2$, $T_2$ being less than $T_1$, and of $t_2$ time duration, both the first and second timing means starting substantially simultaneously, and detecting means coupled to the first and second timing means detecting their output pulses and providing a single output when the two output pulses coincide.

Figure 1:
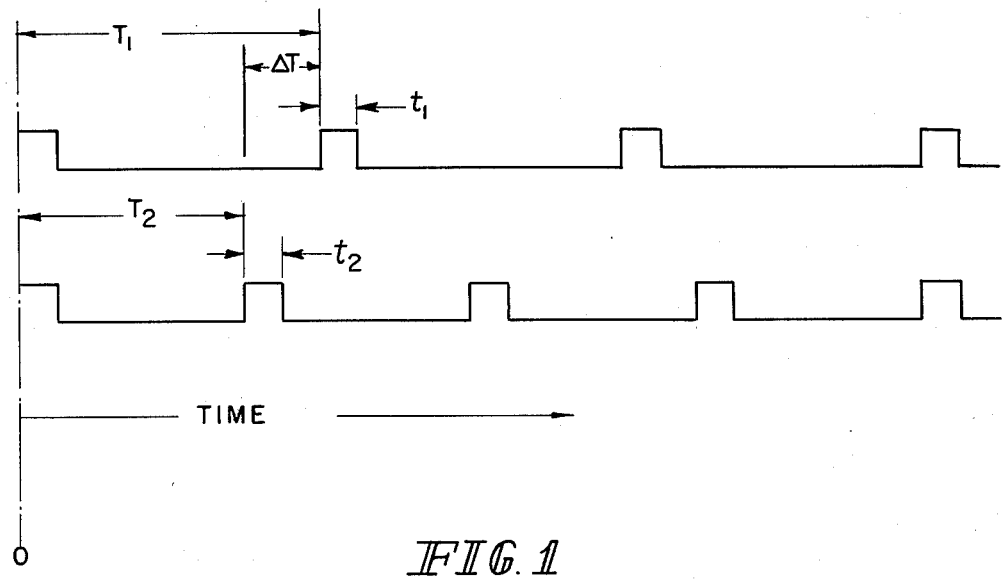
FIG. 1 is a time chart showing the relationship of the output pulses between two timing means.

The operating principle of the timer of the present invention is based on correlating the individual series of pulses of two timing means to produce a single output from such correlation, the series of pulses being of slightly different frequencies. The output is produced only when the two separate pulses from the two timing means coincide, which will occur at a frequency equal to the difference between the frequencies of the two original timing means. Since this is a small difference, the period of the output (1/frequency) can be made very long. This is illustrated in FIG. 1 wherein $T_1$ and $T_2$ are two time constants of two separate timing means. As shown, the two time constants start simultaneously from an arbitrary starting point, which for the purposes of illustration have been designated as time zero. The time constants $T_1$ and $T_2$ are indicated as being from the start of a single pulse of $t_1$ and $t_2$ duration, to the beginning of another pulse. The difference between these two time constants may be expressed as $\Delta T$ and be expressed mathmatically as $\Delta T = T_1 - T_2$.

If $T_1$ is an integral multiple (n) of $\Delta T$, pulse $t_2$ will lag pulse $t_1$ by $\Delta T$ seconds more for each pulse of $t_2$ and will be synchronized again after n pulses of $T_2$. Thus, as an example, and referring to FIG. 1, for a 3 minute time interval or constant $T_2$ and a 4 minute time interval $T_1$, the pulses $t_1$ and $t_2$ would be synchronized or would coincide every 12 minutes at which time there could be a single output. Expressed mathematically, if $T_1$ is an integral multiple (n) of $\Delta T$, then the time interval T at which the single output may be produced may be expressed as:

$$T = nT_2 = \frac{T_1}{\Delta T} \times T_2$$

and since $$\Delta T = T_1 - T_2$$

$$T = \frac{T_1 \, T_2}{T_1 - T_2}$$

Thus it is seen that the smaller the difference in frequency between $T_1$ and $T_2$, the longer will be the time interval T.

For those situations where $T_1/\Delta T$ is not an integer it is necessary that the pulses $t_1$ and $t_2$ overlap near time T in order to insure that a single output is obtained. This is insured if the sum of $t_1$ and $t_2$ is greater than $\Delta T$.

Figure 2:
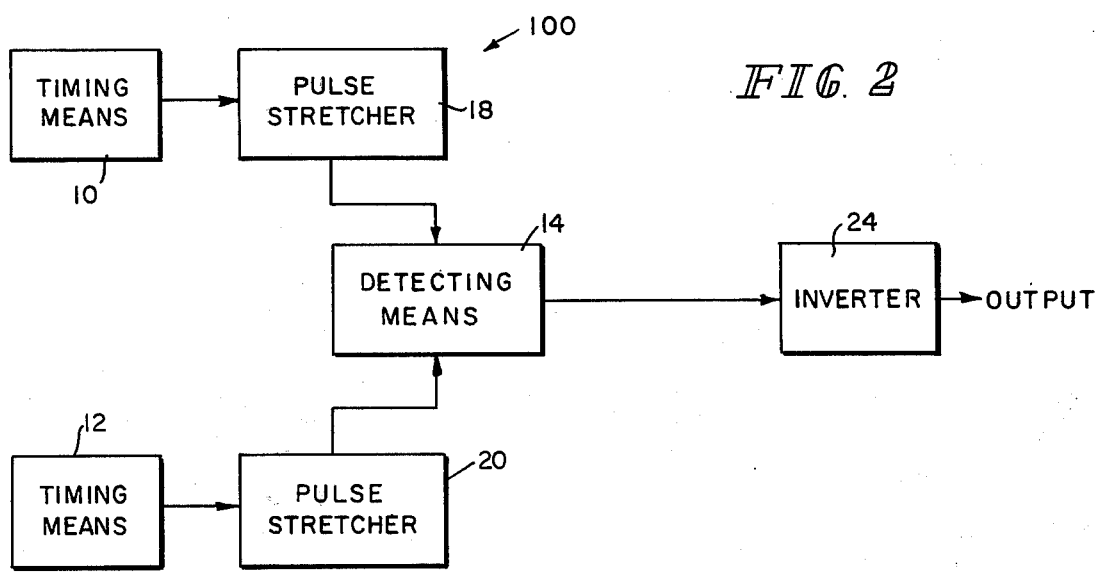
FIGS. 2 and 3 are block diagrams showing the functional relationships between the elements of two embodiments of the timer of the present invention.

Referring now to FIG. 2, there is shown a block diagram showing the relationship of the component parts of the timer of the present invention. Timer 100 includes first and second timing means 10 and 12 which generate a series of output pulses and, when they coincide as determined by detecting means 14, delivers an output. The output can then be used to drive a device such as an appliance at predetermined time intervals dependent upon the time between the single outputs. When using an electronic timing means, a series of pulses generated by the timing means 10 and 12 could be of very short duration (spikes on a voltage trace). In such instances, the detecting means 14 would have difficulty correlating the pulses. Therefore, the present invention contemplates the use of pulse stretching means 18 and 20 to stretch the pulses emanating from the individual timing means prior to their being picked up by the detecting means 14. Generally speaking, the output generated by the detecting means will be, in the case of electronic circuitry, a DC output pulse of a predetermined polarity. Where necessary, the invention further contemplates the use of an inverter means 24 to change the polarity of the pulse, for example, from negative to positive.

Figure 3:
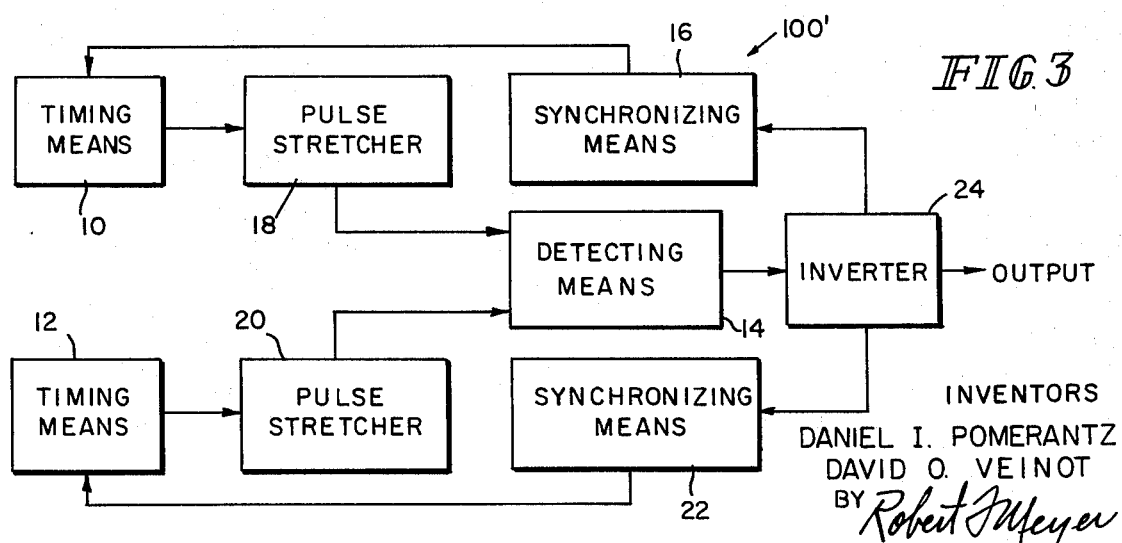

For those situations where $t_1$ and $t_2$ need to overlap in order to insure that a single output is obtained (i.e. $t_1 + t_2 > \Delta T$) there arises the possibility of obtaining two successive output pulses separated by $\Delta T$, that is double pulsing. This can occur if the leading edge of a pulse from timer 2 (FIG. 1) slightly overlaps the trailing edge of a pulse from timer 1, thus producing an output pulse and subsequently a second output pulse $\Delta T$ later when the trailing edge of a pulse from timer 2 overlaps the leading edge of a pulse from timer 1. To make this impossible, both timing means may be interrupted by the first output pulse and restarted at the same time. As illustrated in FIG. 3, this is accomplished in timer 100' by a pair of synchronizing means 16 and 22 coupled between inverter means 24 and their respective timing means. It should be understood, however, that in those cases where an inverter means is not needed, the synchronizing means could be coupled to the detecting means 14.

Figure 4:
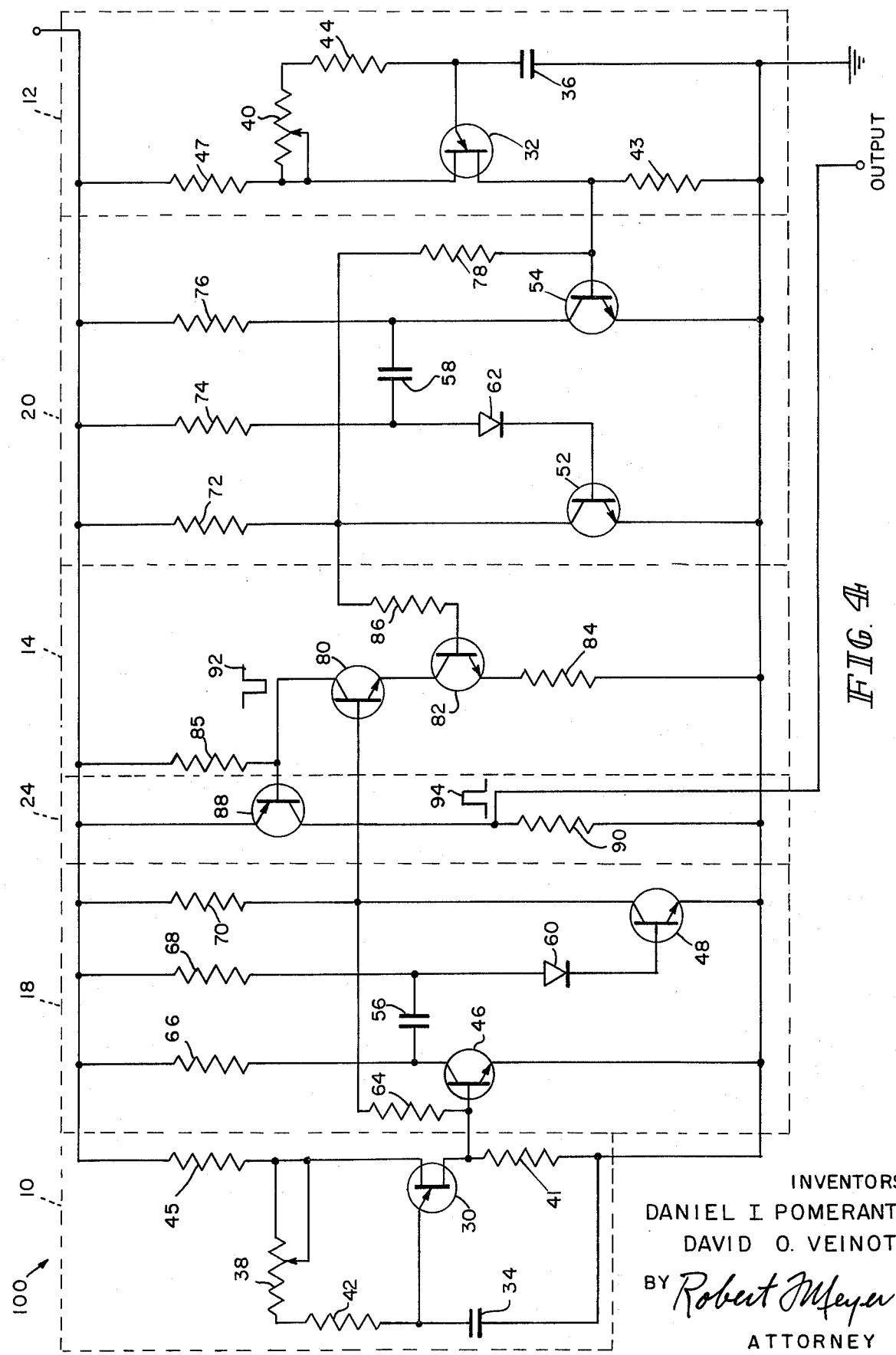

Referring now to FIG. 4, an embodiment of the invention is shown. Timer 100 includes timing means 10 and 12, pulse stretcher means 18 and 20, detecting means 14 and inverter means 24. As shown, each of the component parts are connected across an DC power source. Both timing means 10 and 12, in the present embodiment, comprise unijunction oscillator means which includes unijunction transistors 30 and 32, the emitters of which are connected to capacitors 34 and 36 and variable resistors 38 and 40 through current limiting resistors 42 and 44, and transistor load resistors 41 and 43. Variable resistors 38 and 40, which are in series with load resistors 45 and 47, respectively, provide the time intervals $T_1$ and $T_2$ respectively. The pulse stretching means 18 and 20 are identical and comprise monostable multivibrators each of which includes a pair of transistors 46, 48, and 52, 54 and capacitors 56, 58, and diodes 60, 62. There is also included as part of the multivibrators biasing resistors 64, 66, 68, 70, 72, 74, 76 and 78. More specifically, with respect to one of the pulse stretching means, a base of transistor 46 is connected to the timing means 10, the emitter connected to ground, and its collector connected to the base of transistor 48 through capacitor 56 and diode 60. The emitter of transistor 48 is connected to ground and its collector is connected to detection means 14. The elements of pulse stretcher 20 are connected in like manner.

Detector means 14 comprises an AND gate which includes a pair of transistor 80 and 82 and load resistors 84, 85 and 86. The base of transistor 80 is connected to the pulse stretching means 18, the collector to the inverter means 24 and its emitter to the collector of transistor 82. The base of transistor 82 is connected to the pulse stretcher means 20 and its emitter is connected to ground. Inverter means 24 includes a transistor 88 and load resistor 90, the emitter of the transistor being connected to one side of the power supply, the base being connected to the detecting means 14 and one side of the power supply, and the collector being connected to ground.

In operation, the resistance values of resistors 38 and 40 of the unijunction oscillator timing means 10 and 12 respectively are set in accordance with the desired time intervals $T_1$ and $T_2$ respectively. When a voltage is applied across the timing means, a series of impulses will be emitted therefrom at $T_1$ and $T_2$ time intervals. The pulses will be of very short duration and will be applied to the transistors of the monostable multivibrators of the pulse stretching means 18 and 20. Pulse stretching means lengthens the duration of the pulses with their output voltages being applied to the bases of transistors 80 and 82 of the AND gate of detecting means 14. Detecting means senses these pulses and when they coincide, delivers a DC output pulse or voltage of a predetermined polarity, indicated generally at 92, to inverter means 24. Inverter means 24 reverses the polarity and delivers an output pulse indicated generally at 94.

As previously noted, in those situations where $t_1 + t_2$ is greater than $\Delta T$, double pulsing is prevented by synchronizing means 16 and 22 which interrupts timing means 10 and 12 respectively as the output is delivered from inverter means 24. Timing means 10 and 12 then restart simultaneously at the end of the output pulse. Referring to FIG. 5, synchronizing means 16 and 22 are identical and include switching means such as SCRs 91 and 95 and biasing resistors 96, 97, 99 and 101. The anode of SCR 91 is connected to timing means 10 through current limiting resistor 93; the cathode to a side of the power supply, and the gate to the inverter means 24 through biasing resistor 97. Similar connections are made for synchronizing means 22, there being also included a current limiting resistor 98 for SCR 95.

In operation, the output from inverter means 24 triggers SCRs 91 and 95 which discharges capacitors 34 and 36 respectively. The capacitors will remain discharged until the end of the output pulse at which point the signal to the gate of the SCR being removed, the SCR will turn off (open circuit) and both capacitors will simultaneously start to recharge, starting the timing means 10 and 12.

What is claimed is:

1. A method of providing long time intervals comprising:

a. producing a first series of output pulses at $T_1$ time intervals and of $t_1$ duration, b. producing a second series of output pulses at $T_2$ time intervals and of $t_2$ time duration, $T_2$ being less than $T_1$, and the sum of $t_1$ and $t_2$ being greater than the difference between $T_1$ and $T_2$, said series of output pulses starting substantially simultaneously, and c. detecting both said series of output pulses and providing outputs at time intervals $$T = \frac{T_1 \, T_2}{T_1 - T_2}$$

when said series of output pulses coincide.

2. The method according to claim 1 wherein said $T_1$ time interval is an integral multiple of the difference between $T_1$ and $T_2$.

3. The method of claim 1 further including the step of lengthening said output pulses prior to being detected.

4. The method according to claim 1 further including the step of reversing the polarity of a DC output after said series of outputs have been detected.

5. The method according to claim 1 further including the step of interrupting said first and second series of output pulses to synchronize their starting times in accordance with said output.

* * * * *

UNITED STATES PATENT OFFICE
CERTIFICATE OF CORRECTION

PATENT NO. : 3,959,731
DATED : May 25, 1976
INVENTOR(S) : D.I. Pomerantz et al

It is certified that error appears in the above—identified patent and that said Letters Patent are hereby corrected as shown below:

Col. 4, line 68 after "$t_1$" insert ---time---.

Signed and Sealed this

Thirty-first Day of August 1976

[SEAL]

Attest:

RUTH C. MASON
Attesting Officer

C. MARSHALL DANN
Commissioner of Patents and Trademarks